United States Patent [19]

Küpfer

[11] 4,064,467

[45] Dec. 20, 1977

[54] SEMICONDUCTOR-OSCILLATOR EMPLOYING LOGIC CIRCUITRY HAVING AT LEAST ONE ACTIVE ELEMENT

[75] Inventor: Hanspeter Küpfer, Scherz, Switzerland

[73] Assignee: Siemens-Albis Aktiengesellschaft, Zurich, Switzerland

[21] Appl. No.: 706,843

[22] Filed: July 19, 1976

[30] Foreign Application Priority Data

Aug. 26, 1975 Switzerland .................. 11019/75

[51] Int. Cl.² .................................. H03K 3/28
[52] U.S. Cl. .......................... 331/108 D; 331/111; 331/113 R; 331/143; 331/177 V
[58] Field of Search .............. 331/108 R, 108 D, 111, 331/113 R, 135, 143, 177 R, 177 V, 57

[56] References Cited

U.S. PATENT DOCUMENTS 3,680,003  7/1972  Walker ........................ 331/108 D

FOREIGN PATENT DOCUMENTS 1,809,207  6/1970  Germany ...................... 331/113 R

OTHER PUBLICATIONS

Dean et al., "Astable and Monostable Oscillators Using RCA COS/MOS Digital Integrated Circuits", RCA Application Note ICAN-6267, Mar. 1971, pp. 353–360.
Byers, Jr., "Power Your Oscillator with ECL," Electronic Design, vol. 16, Aug. 1, 1968, pp. 70, 71.

Primary Examiner—Siegfried H. Grimm
Attorney, Agent, or Firm—Werner W. Kleeman

[57] ABSTRACT

A semiconductor-oscillator comprising a logic circuit having at least one active element, the one input of which is connected by means of a resistor with an inverting output and the same input is connected by a capacitor with a non-inverting output.

13 Claims, 5 Drawing Figures

SEMICONDUCTOR-OSCILLATOR EMPLOYING LOGIC CIRCUITRY HAVING AT LEAST ONE ACTIVE ELEMENT

BACKGROUND OF THE INVENTION

The present invention relates to a new and improved construction of semiconductor-oscillator.

Numerous analog-and digital-oscillators of the most varying technological constructions are known in the art. The oscillation frequency of an oscillator is governed either by an oscillatory or tank circuit (harmonic oscillator) or by a discharge operation (relaxation oscillator), as for example in the case of an astable multivibrator. In this regard attention is directed to the publication of Rolf Hahn, Elektronische Schaltkreissysteme, Grundlagen, Aufbau und Anwendung, pgs. 116 – 125 (chapter 3.4. Bausteine mit Zeitverhalten), Berlin-Munchen 1971. An exact differentiation between analog-oscillators and digital-oscillators is no longer possible at high frequencies, due to delay times and the pulse edge rise times which occur when operating at the region of the boundary frequency of the components. The conventional RC-and LC-oscillators therefore must be replaced by new circuits for high-frequency applications. Additionally, in the case of LC-oscillators which are conventionally controlled in the higher frequency range, a further drawback is the constricted frequency-pulling range which exists due to the dependency of the frequency-pulling range upon the variation element, this dependency of the frequency-pulling range being governed by the square root of C or LC.

There are known digital oscillators which operate at a greater relatively constant oscillating frequency. These oscillators consist of chains having an uneven number of inverting logic switching circuits and a signal feedback from the last element of the chain to the first element of the chain. However, such type oscillators have the drawback that the oscillation frequency is fixed by the switching times of the logic switching circuits and tuning of the oscillation frequency only can be accomplished with difficulty.

The problem of fluctuation reactions of the signal amplitude of RC-oscillators was recognized in detail by the study carried out by C. Koken, appearing in Internationale Elektronische Rundschau, Volume 5, pgs. 97-101. The analyzed basic configurations of oscillator circuits allow for the analysis of known circuit arrangements and the synthesis of new, yet to develop arrangements.

SUMMARY OF THE INVENTION

It is a primary object of the present invention to provide a new and improved construction of an oscillator which enables complete utilization of the high boundary frequency of high speed logic circuits, the oscillation frequency of which can be tuned in a most simple manner and the tuning elements allow for as high as possible frequency-pulling range.

Further, it is an object of the present invention to provide a circuit arrangement which, at low oscillating frequencies, functions as a digital flip-flop stage and at high frequencies at the region near the boundary frequency of the employed active element, as an analog oscillator.

Now in order to implement these and still further objects of the invention, which will become more readily apparent as the description proceeds, the invention is manifested by the features that there is provided a logic circuit having at least one active element, one input of which is connected via a resistor with an inverting output and the same input via a capacitor with a non-inverting output.

In contrast to heretofore known generally low-frequency RC-oscillators the inventive oscillator takes into account the systematic delay time inherent in each active element for forming the required frequency determining-time constant. Such oscillators are exceptionally well suited for high-frequency applications; the output signal is sinusoidal. With appropriate dimensioning of the frequency determining-time constants the oscillator operates as a digital oscillator; the output signal, for this application, is a squarewave.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Describing now the drawings, a first inverting output $\bar{A}_1$ of a logic circuit $LS_1$ is connected via a choke $L_{V1}$, a resistor R connected in series with the choke $L_V$ and having a compensation capacitor $C_K$ connected in parallel with the resistor R, with the single effective input E of the logic circuit $LS_1$. The resistor R is advantageously a variable resistor in order to control the oscillation frequency of the oscillator and may be constituted by an electrically controllable semiconductor resistor. A second non-inverting output $A_2$ of this logic circuit $LS_1$ is connected via a series circuit consisting of a further choke $L_{V2}$ and a capacitor C, preferably a variable capacitor, with the same input E of the logic circuit $LS_1$. An input 8 of a further logic circuit $LS_2$ is connected with the output $A_2$ of the oscillator. An output 3 of this logic circuit $LS_2$ carries the useful signal S of the oscillator. Both the logic circuit $LS_1$ and also the logic circuit $LS_2$ possess a terminal $M_1$ and $M_2$, respectively which serve as the common antipole for all inputs and outputs of the relevant logic circuits. Each of the semiconductor logic circuits $LS_1$ and $LS_2$ may be of the emitter-coupled type.

Figure 2A:
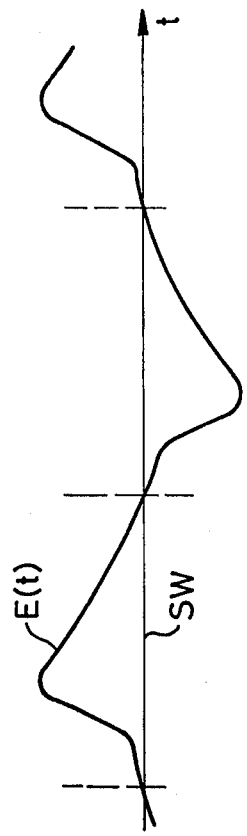
FIGS. 2a, 2b and 2c are oscillograms of an oscillator in its oscillating state.
Figure 2B:
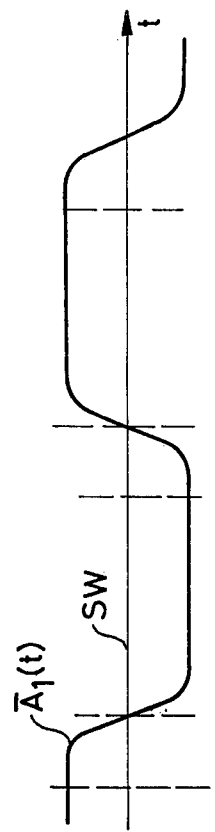
Figure 2C:
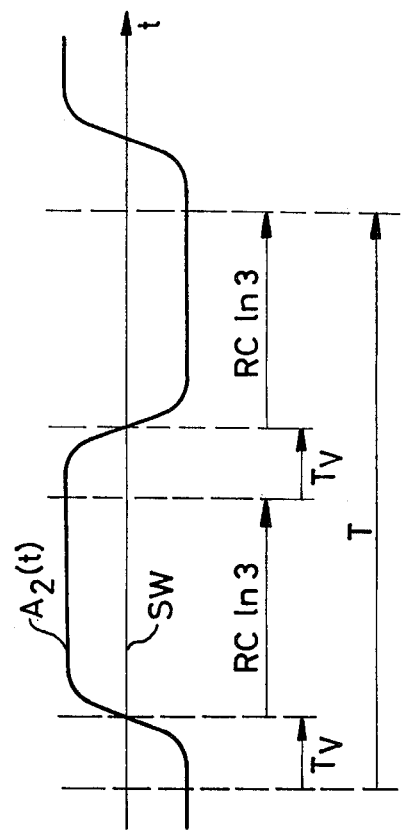

The very simple mode of operation of the oscillator in its oscillating state can be recognized based upon the oscillograms of FIGS. 2a, 2b and 2c. Initially there will not be taken into account the effect of the chokes $L_{V1}$, $L_{V2}$ and the compensation capacitor $C_K$. Accordingly, the chokes $L_{V1}$, $L_{V2}$ are to be considered as having been replaced by a respective short-circuit connection and the compensation capacitor $C_K$ by a so-called open-circuit, i.e., has been removed. At the input E of the logic $LS_1$ there will be observed the signal course as a function of time which has been portrayed in FIG. 2a. The switching threshold value of the logic circuit is designated by reference character SW. At the inverting output $\bar{A}_1$ there appears, as a function of the logic circuit $LS_1$ operating in a conventional manner, an output signal as shown in FIG. 2b. The signal course at the output $A_2$ of the logic circuit exhibits the inverse behavior of that of FIG. 2b as shown in FIG. 2c.

This can be expressed by the following equation:

$$T = 2 \cdot (T_v + RC \cdot \ln 3)$$

wherein:
$T_V$ = delay time of the logic circuit
RC = time constant; product of the resistance R and capacitance C
T = oscillation period
ln3 = natural log to the base 3

Each logic circuitry which is known from switching circuit technology and having both an inverting as well as also a non-inverting output can be used in the oscillator of the present invention. The non-employed inputs of the relevant logic circuit are connected with a fixed, logic potential. It is immaterial whether the employed logic circuits are for instance AND/NAND-stages or OR/NOR-stages. In order to realize maximum frequencies it is, however, advantageous if the switching pulse edge at the inverting and non-inverting output of the logic circuit occur at the same time. Accordingly, the emitter-coupled-logic (ECL) which is known for digital computer technology is advantageous and allows constructing oscillator circuits operating with frequencies up to the UHF-range.

Figure 1:
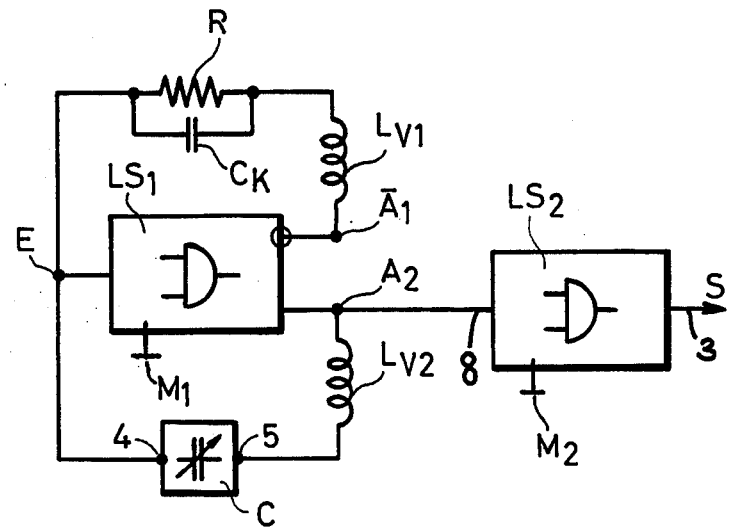
FIG. 1 is a circuit diagram of an oscillator having an output leading to a logic circuit.

The oscillator circuit of FIG. 1 can be augmented in a simple manner into a voltage-controlled oscillator (VCO). For this purpose the capacitor C is, for instance, replaced by a circuit of the type shown in FIG. 3.

Two capacitance-variation diodes, so-called varactors (VARICAPS) $C_{V1}$, $C_{V2}$ are connected with their cathodes to one another. Both of the anodes of these diodes $C_{V1}$, $C_{V2}$ thus form the connection terminals 4 and 5 (FIG. 1). A resistor $R_{S1}$ is connected with the cathode-connections or junction of both diodes $C_{V1}$, $C_{V2}$ and in series therewith there is connected a further resistor $RS_2$. The junction or connection of both resistors $RS_1$, $RS_2$ is additionally coupled with a first terminal of a capacitor $C_S$, a second terminal of the capacitor $C_S$ is connected with a common antipole $M_3$.

The operation of such type electrically controllable semiconductor capacitances is basically known. By means of a control voltage $U_{St}$ applied at a terminal 6 the oscillator frequency can be controlled over a wide range.

Assuming that there are provided two identical varactors ($C_{V1} = C_{V2} = C_V = 2C$) there is valid:

$$f_{min} = \frac{1}{2T_v + RC_{v\,max} \cdot \ln 3}$$

wherein:
$C_{V max.}$ = maximum controllable capacitance value of both varactors $C_{V1}, C_{V2}$
$f_{max.}$ = maximum oscillator frequency $$f_{max} = \frac{1}{2T_v + RC_{v\,min} \cdot \ln 3}$$

wherein :
$C_{V min.}$ = minimum controllable capacitance value of both varactors $C_{V1}, C_{V2}$.

The compensation capacitor $C_K$ (FIG. 1) serves to increase the maximum oscillator frequency by compensation of the minimum proportion of the time-constant RC formed by the capacitor C. As an approximate value there is valid for $C_K = C_{min} = 0.5\, C_{V\,min}$ In a controlled oscillator $C_K$ consequently also increases the pull range of the oscillator frequency.

There is valid:

$$f = \frac{1}{2T_v + R(C_v - 2C_K) \ln 3}$$

wherein when $C_K = 0.5 C_{v\,min}$ and $C_v = C_{v\,min}$ there is valid:

$$f_{max} = \frac{1}{2T_v}$$

Consequently, it follows that an oscillator circuit designed according to the invention then also can attain the boundary frequency of the logic circuit when $C_{V min} > 0$.

It is known there exist logic cirucits whose pulse edge rise time is greater than the delay time. For this reason an oscillator operating with such type logic circuits and driven with maximum operating frequency could not deliver at its output the complete amplitude. By means of chokes $L_{V1}, L_{V2}$ having low inductance or also by a further or single choke at the input E of the logic circuit $LS_1$ it is possible by working together with the input capacitance to optimize by simple experimentation the time delays and to accommodate the same and with the maximum frequency only thus slightly reduced to obtain the full amplitude of the oscillations of the oscillators.

Figure 3:
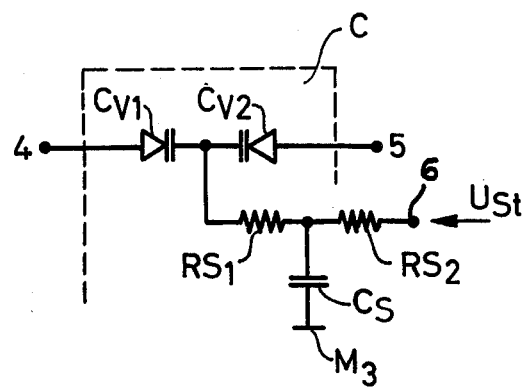
FIG. 3 illustrates a circuit arrangement for controlling the oscillator frequency.

By means of so-called PIN-diodes (diodes having a zone sequence P-I-N) there equally can be constructed a circuit operating analogous to FIG. 3. The observations made in conjunction with the example of a capacitance-variation diode (varicap) here likewise apply. As is known a PIN-diode constitutes a variable high-frequency resistor and allows for a corresponding control of the oscillating frequency of the oscillator.

It is also conceivable to employ a similar operating frequency determining-tuning means as well as continuous or surge-like operating combinations consisting of tuning means of the most different types.

While there are shown and described present preferred embodiments of the invention, it is to be distinctly understood that the invention is not limited thereto, but may be otherwise variously embodied and practiced within the scope of the following claims. ACCORDINGLY,

What is claimed is:

1. A semiconductor-oscillator operating with frequencies up to the UHF-range, comprising a logic circuit containing at least one active element, said at least one active element of said logic circuit possessing an input, an inverting output and a non-inverting output, a resistor connecting the input with the inverting output, a first capacitor connected in parallel with said resistor, a second capacitor connecting said input with the non-inverting output, said logic circuit being structured to deliver respective switching pulses at said non-inverting output and said inverting output having switching pulse edges which appear approximately at the same time.

2. The semiconductor-oscillator according to claim 1, wherein the logic circuit comprises an emitter-coupled circuit arrangement.

3. The semiconductor-oscillator as defined in claim 1, wherein the non-inverting output and a terminal common to all inputs and outputs form an antipole of the oscillator output.

4. The semiconductor-oscillator as defined in claim 1, further including an emitter-coupled logic circuit arrangement constituting a driver stage and constituting the only component connected with the oscillator output defined by said non-inverting output.

5. The semiconductor-oscillator as defined in claim 1, wherein the second capacitor possesses variable capacitance for controlling the oscillating frequency of the oscillator.

6. The semiconductor-oscillator as defined in claim 5, wherein the second capacitor comprises at least an electrically controllable-semiconductor capacitance.

7. A semiconductor-oscillator comprising a logic circuit containing at least one active element, said logic circuit possessing an input, an inverting output and a non-inverting output, a resistor connecting the input with the inverting output, a capacitor connecting said input with the non-inverting output, and a capacitor connected in parallel with said resistor.

8. A semiconductor-oscillator comprising a logic circuit containing at least one active element, said logic circuit possessing an input, an inverting output and a non-inverting output, a resistor connecting the input with the inverting output, and a capacitor connecting said input with the non-inverting output, and a respective choke connected in series with the resistor and the capacitor.

9. The semiconductor-oscillator as defined in claim 8, wherein each choke is connected with at least one respective output of the logic circuit.

10. The semiconductor-oscillator as defined in claim 8, wherein each choke is connected with the input of the logic circuit.

11. The semiconductor-oscillator as defined in claim 1, wherein the resistor is a variable resistor for controlling the oscillating frequency of the oscillator.

12. The semiconductor-oscillator as defined in claim 11, wherein the variable resistor consists of at least one electrically controllable semiconductor-resistor.

13. The semiconductor-oscillator as defined in claim 1, wherein the second capacitor is a variable capacitor and the resistor is a variable resistor.

* * * * *